(12) United States Patent
Kan

(10) Patent No.: US 6,407,652 B1
(45) Date of Patent: Jun. 18, 2002

(54) ADAPTERS FOR RF CONNECTORS

(75) Inventor: David T. Kan, Rancho Palos Verdes, CA (US)

(73) Assignee: Pulse Research Lab, Torrance, CA (US)

( * ) Notice: Subject to any disclaimer, the term of this patent is extended or adjusted under 35 U.S.C. 154(b) by 0 days.

(21) Appl. No.: 09/440,304

(22) Filed: Nov. 17, 1999

Related U.S. Application Data

(60) Provisional application No. 60/109,039, filed on Nov. 19, 1998.

(51) Int. Cl.[7] .............................. H01P 1/00; H05K 1/00
(52) U.S. Cl. ........................... 333/260; 439/63; 439/75
(58) Field of Search ........................ 333/260; 439/63, 439/65, 74, 75

(56) References Cited

U.S. PATENT DOCUMENTS

| | | | |
|---|---|---|---|
| 3,201,722 A | 8/1965 | May et al. ..................... 333/84 |
| 4,604,678 A | 8/1986 | Hagner ........................ 361/761 |
| 4,816,791 A | 3/1989 | Carnahan et al. ............. 333/33 |
| 5,120,258 A | 6/1992 | Carlton ........................ 439/581 |
| 5,151,039 A | 9/1992 | Murphy ........................ 439/70 |
| 5,173,767 A | 12/1992 | Lange et al. ................ 257/664 |
| 5,424,693 A | 6/1995 | Lin .............................. 333/33 |
| 5,572,409 A | 11/1996 | Nathan et al. .............. 361/806 |
| 5,612,657 A | 3/1997 | Kledzik ....................... 333/247 |
| 6,090,647 A | 7/2000 | Grass ........................... 438/151 |
| 6,164,997 A | * 12/2000 | Lester ......................... 439/63 |

* cited by examiner

Primary Examiner—Robert Pascal
Assistant Examiner—Kimberly Glenn
(74) Attorney, Agent, or Firm—Fish & Richardson P.C.

(57) ABSTRACT

A plurality of adapters is disclosed for connecting RF connectors to a printed circuit board. The adapters each include a foot print for receiving the RF connector and a plurality of pins for mounting the connector to a prototyping board. The output signal of the RF connector may be coupled to an controlled impedance transmission line, and each adapter is also configured with a ground plane. The adapters may be configured for use with connectors, such as SMA and BNC connectors. The adapters support easy connection of the RF connector to the prototyping board and minimize the noise associated with the output signal of the RF connector.

30 Claims, 2 Drawing Sheets

ADAPTERS FOR RF CONNECTORS

CROSS-REFERENCE TO RELATED APPLICATIONS

This application claims priority to U.S. Provisional Patent Application No. 60/109,039, filed Nov. 19, 1998.

BACKGROUND OF THE INVENTION

The present invention relates generally to adapters for electrical devices, and more particularly, to single in-line (SIP) or dual in-line (DIP) adapters for radio frequency (RF) connectors that may be mounted to a printed circuit board (PCB).

Many RF connectors are known including Bayonet Nut Connectors (BNC), end-launch Sub Miniature Series A (SMA) connectors, and "F" connectors. Often, these connectors are used in breadboards and prototype circuits using RF devices. However, when prototyping or breadboarding, a significant amount of time is wasted in mounting and connecting the connectors to the PCB. This is because known PCBs do not have a compatible foot print to receive the RF connector. To mount the connector to the PCB, extra holes may be drilled, copper foil may be added to form a ground plane for low impedance connections, and unwanted ground plane area may be cut away to form transmission paths for surface-mount connectors. Accordingly, mounting the RF connector can be laborious and expensive.

Known RF connectors can be used to operate attached devices at high frequency levels. This means that the devices require controlled impedance inputs and outputs that are not easily configured in known PCBs. Certain commercially available SIP and DIP adapters require long traces between the device foot print and the pins of the SIP and DIP. This can create excessive noise in the resulting signal and poor performance from the integrated circuit.

Therefore, there is a need for an adapter that can be easily and accurately configured for a variety of RF connectors for breadboarding or prototyping applications, and that is also capable of providing controlled impedance and can substantially eliminate noise.

SUMMARY OF THE INVENTION

In general, in one aspect, the invention is directed to an adapter for a radio frequency connector that includes a printed circuit board having a plurality of first holes. A first layer may be attached to a first side of the printed circuit board, and may have a plurality of second holes. A second layer may be attached to a second side of the printed circuit board, and may have a plurality of third holes. A plurality of headers may pass partially through the first, second, and third holes. At least one transmission line may be formed on the first or second layer. The at least one transmission line may be in electrical communication with the radio frequency connector and the radio frequency connector may be mounted to at least a portion of the printed circuit board.

Implementations of the invention include one or more of the following. The printed circuit board may be formed from polymer, plastic, or resin. The first layer or the second layer may be a ground plane. The plurality of headers may include a plurality of first ends that are inserted in to a breadboard or a prototyping board. The plurality of headers may include a plurality of second ends that are substantially coplanar with the first or second layer. The radio frequency connector may include a connector to attach to a radio frequency device. The radio frequency connector may operate in the gigahertz range. The adapter may be a BNC DIP, a SMA DIP, a single SMA SIP, a single SMA DIP, or a dual SMA SIP adapter. At least one transmission line may be a 50 Ohm controlled impedance transmission line. The at least one transmission line may be connected between a center conductor of the radio frequency connector and selected ones of the plurality of headers. The first and second layers and the printed circuit board may each contain a plurality of openings that are vertically or horizontally aligned with each other. The plurality of openings may define a footprint for the radio frequency connector. The plurality of openings may be used to secure the printed circuit board to the first and second layers. The number of first, second, and third holes may be equal to or greater than the number of the plurality of headers. The radio frequency connector may be a BNC or SMA connector.

In another aspect, the invention is directed to an adapter for a radio frequency connector that includes a printed circuit board having a first set of holes. A ground plane may be connected at least partially to the printed circuit board and may include a second set of holes that are aligned with the first set of holes. A first layer having a third set of holes that are aligned with the first and second sets of holes may be positioned proximate the printed circuit board. A plurality of headers may pass partially through the first, second, and third holes and at least one transmission line may be formed on the first layer. The at least one transmission line may be in electrical communication with the radio frequency connector. The radio frequency connector may be mounted to at least a portion of the printed circuit board.

Implementations of the invention may include one or more of the following. The radio frequency connector may be a BNC connector. The adapter may be a BNC SIP or a BNC DIP adapter. The printed circuit board, the ground plane, and the first layer may each contain a plurality of openings that define a footprint for the BNC connector. The transmission line may be connected between center conductor of the BNC connector and one of the plurality of headers. The adapter may be connected to a prototyping board or a mother board via the plurality of headers. The transmission line may be a 50 Ohm controlled impedance transmission line.

In a further aspect, the invention is directed to an adapter for a radio frequency connector that includes a printed circuit board having a first set of holes. A first layer may be connected at least partially to the printed circuit board, and may include a second set of holes that are aligned with the first set of holes. A ground plane having a third set of holes that are aligned with the first and second sets of holes may be positioned proximate the printed circuit board. A plurality of headers may pass partially through at least some of the first, second, and third holes. At least one transmission line may be formed on the first layer. The at least one transmission line may be in electrical communication with the radio frequency connector, and the radio frequency connector may be mounted to at least a portion of the printed circuit board.

Implementations of the invention may include one or more of the following. The radio frequency connector may be a SMA connector. The printed circuit board, the ground plane, and the first layer may be at least partially sandwiched between a plurality of leads of the SMA connector. The at least one transmission line may be connected between a center conductor of the SMA connector and one of the plurality of headers. The adapter may be connected to a prototyping board or a mother board via the plurality of headers. The at least one transmission line may be a 50 Ohm controlled impedance transmission line. The adapter may be a single SMA DIP adapter.

In yet a further aspect, the invention is directed to an adapter for at least one radio frequency connector that includes a printed circuit board having a first set of holes. A ground plane may be connected at least partially to the printed circuit board, and may include a second set of holes that are aligned with the first set of holes. A first layer having a third set of holes that are aligned with the first and second sets of holes may be formed proximate the printed circuit board. A plurality of headers may pass partially through at least some of the first, second, and third holes. At least one transmission line may be formed on the first layer. The at least one transmission line may be in electrical communication with the at least one radio frequency connector, and the at least one radio frequency connector may be mounted to at least a portion of the printed circuit board.

Implementations of the invention include one or more of the following. The at least one radio frequency connector may be a SMA connector. The adapter may be a dual SMA SIP or a single SMA SIP adapter. The adapter may be connected to a prototyping board or a mother board via the plurality of headers. The at least one transmission line may be a 50 Ohm controlled impedance transmission line. The printed circuit board, the ground plane, and the first layer may be at least partially sandwiched between a plurality of leads of the SMA connector. A center conductor of the SMA connector may be connected to the at least one transmission line.

The details of one or more embodiments of the invention are set forth in the accompanying drawings and the description below. Other features, objects, and advantages of the invention will be apparent from the description and drawings, and from the claims.

DESCRIPTION OF THE PREFERRED EMBODIMENTS

Figure 1:
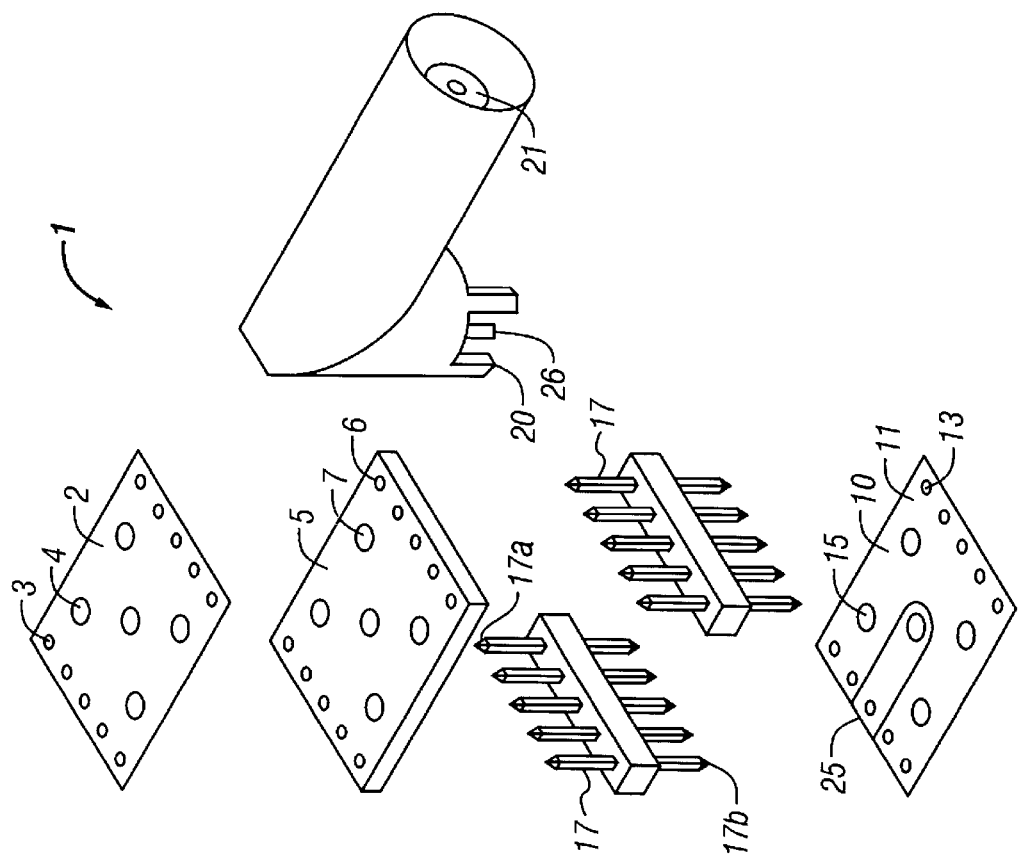
FIG. 1 illustrates a schematic view of a bayonet nut connector (BNC) dual in-line package (DIP).

FIG. 1 illustrates a schematic view of an adapter 1 in accordance with a first embodiment. The adapter 1 may be, for example, a BNC DIP adapter. The adapter includes a ground plane 2 having holes 3 and openings 4. The ground plane 2 may be used to provide an outer grounding surface for an attached RF device. The adapter 1 also includes a printed circuit board (PCB) 5 having holes 6 and openings 7. The PCB 5 may be formed from plastics, polymer, or resins. The adapter 1 also includes a bottom layer 10 having a soldered side 11, holes 13, and openings 15. The PCB 5 may be connected to the ground plane 2 in a conventional manner. In a preferred configuration, the openings 3, 6, and 13 are vertically or horizontally aligned to receive a plurality of headers 17, as shown in FIG. 1. Preferably, the number of openings 3, 6, and 13 is equal to or more than the number of headers 17. Further, when the ground plane 2, the PCB 5, and the bottom layer 10 are secured by the headers 17, the openings 4, 7, and 15 are substantially aligned to define a footprint to receive a plurality of leads 20 of a BNC connector 21. The ground plane 2, the PCB 5, the headers 17, the bottom layer 10, and the BNC connector 21 may be connected in a conventional manner.

The adapter 1 preferably includes one or more transmission lines 25 formed on the bottom layer 10. In one configuration, the transmission line 25 can be used to connect one of the headers 17 to a center conductor 26 of the BNC connector 21. The transmission line may be a 50 Ohm controlled impedance transmission line or other suitable transmission line. This means that high frequency signals can be used to operate an attached radio frequency connector without excessive noise.

The ends 17b of the headers 17 may be designed to be secured to any conventional mother board or prototyping board. In one embodiment, the headers may be designed to connect to a standard 100-mill grid pattern mother board. Preferably, ends 17a of header 17 are substantially coplanar with the ground plane 2, when the adapter 1 is assembled.

Figure 2:
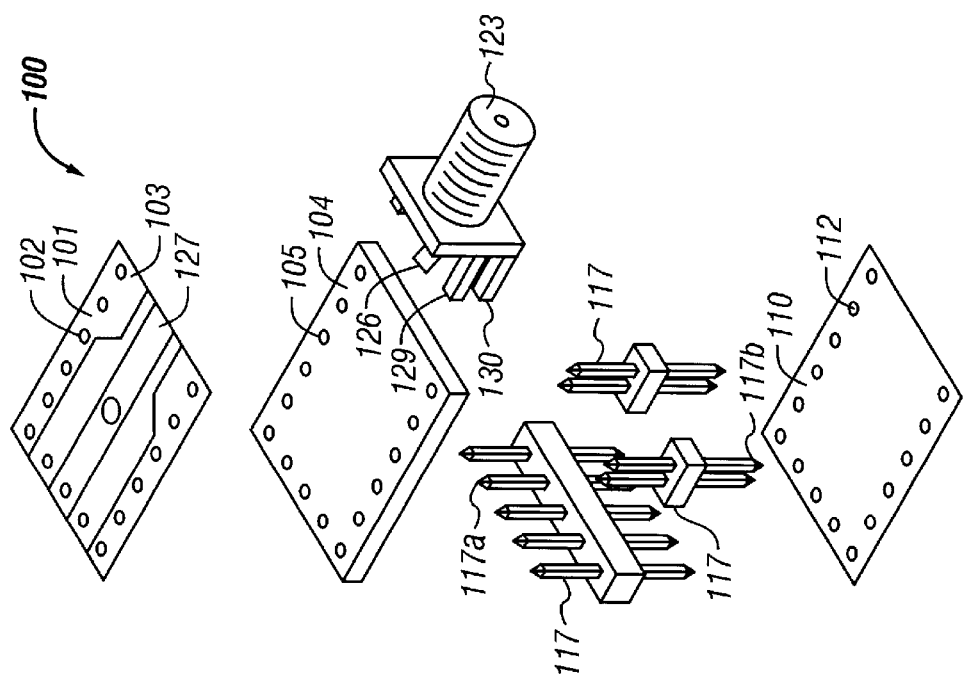
FIG. 2 illustrates a schematic view of a single subminiature series A connector (SMA) DIP.

FIG. 2 illustrates a schematic of an adapter 100 in a second embodiment. In this configuration, the adapter 100 may be a single SMA DIP adapter. The adapter 100 includes a top layer 101 having holes 102 and a component side 103. The adapter 100 also includes a PCB 104 having holes 105. The PCB 104 may be formed from plastics, polymer, or resins. The adapter 100 also includes a ground plane 110 having holes 112. The ground plane is configured to provide an outer grounding surface for an attached RF device. The ground plane 110, and the PCB 104 may be connected in a convention manner. The adapter 100 also includes a plurality of headers 117. In a preferred configuration, the holes 102, 105, and 112 are vertically or horizontally aligned to receive the headers 117. Preferably, the ends 117a of the headers 117 are substantially coplanar with the component side 103 of the top layer 101, when the adapter 100 is assembled. The number of holes 102, 105, and 112 may be equal, and may be equal to or more than the number of headers 117. The bottom side 117b of headers 117 may be configured to be adaptable to any conventional mother board or prototyping board. For example, the. bottom sides 117b may be configured to be adapted to a standard 100-mill grid pattern mother board.

The adapter 100 also includes a SMA connector 123 for receiving a connection from an SMA device. Once configured, the top layer 101, the PCB 104, and the ground plane 110 are preferably sandwiched between the leads 129 of the SMA connector 123. The SMA connector 123 may be mounted to the PCB 104, top layer 101, and, the ground plane 110 in a conventional manner.

In a preferred configuration, a center conductor 126 of the SMA connector 123 may be coupled to the top layer 101 and to one or more transmission lines 127. The transmission lines may be 50 Ohm controlled impedance transmission lines. In this way, the signal path from the output of the SMA connector 123 to the mother board can be controlled for impedance matching.

Figure 3:
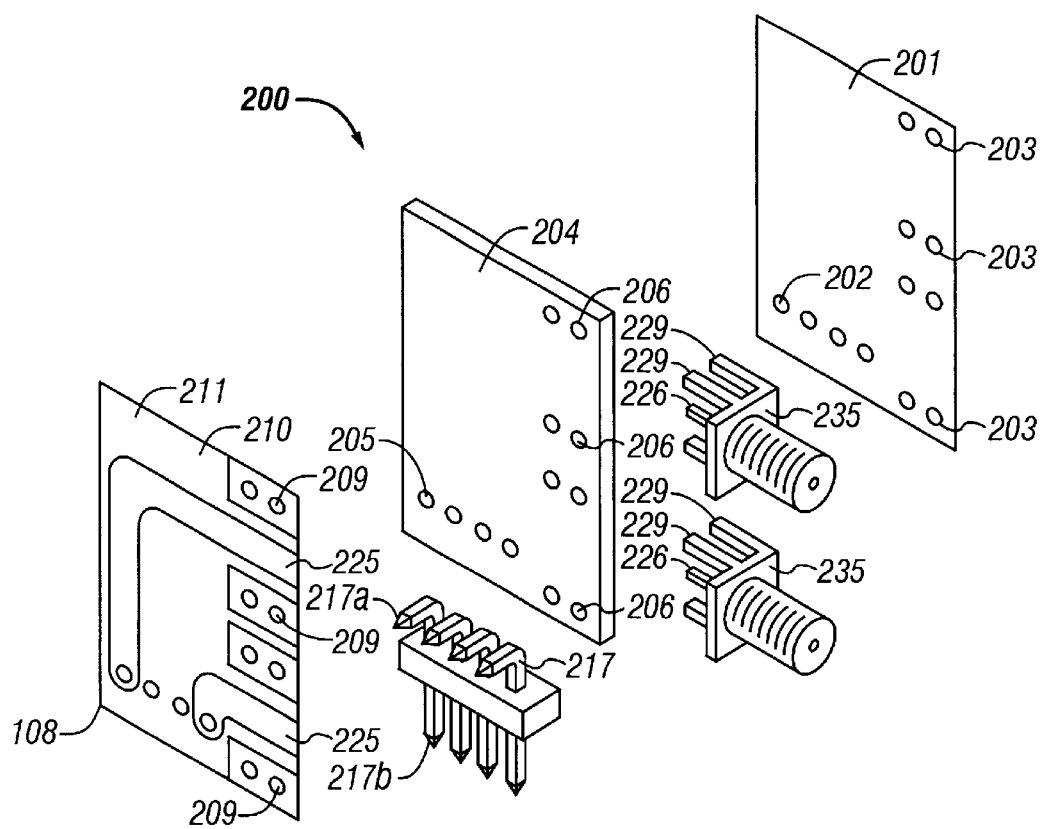
FIG. 3 illustrates a schematic view of a dual SMA single in-line package (SIP).

FIG. 3 illustrates an adapter 200 in a third embodiment. In this configuration, the adapter may be a dual SMA SIP adapter. The adapter 200 includes a ground plane 201 having holes 202 and openings 203. The ground plane 201 may be similar to the ground plane 2 described above. The adapter also includes a PCB 204 having holes 205 and openings 206. The PCB 204 may be similar to the PCB 104 or PCB 5 described above. The adapter 200 also includes a bottom layer 210 having a soldered side 211, holes 208, openings 209, and transmission lines 225. In a preferred configuration, the PCB 204, the ground plane 201, and the bottom layer 210 are coupled to align holes 208, 205, and 202 vertically or horizontally to receive corresponding headers 217. Preferably, the ends 217a of headers 217 are substantially coplanar with the soldered side of the bottom layer 210, when adapter 200 is assembled. The headers 217 may also include bottom ends 217b that are adaptable to any conventional mother board or prototyping board. For example, a standard 100-mill grid pattern mother board may be used. Preferably, the PCB 204, the bottom layer 210, and the ground plane 201 are connected together in a conventional manner. The openings 206 may be used to secure the PCB 204, the bottom layer 210, and the ground plane 201. The to openings 206, 209, and 203 may also be used to connect the ground plane to a footprint for the SMA connectors 235 on the PCB 204.

The adapter 200 may also include SMA connectors 235 having leads 229. Once configured, the PCB 204, the ground plane 201, and the bottom layer 210 may be sandwiched between leads 229 in a conventional manner.

The adapter 200 may also include one or more transmission lines 225. The transmission lines 225 may be 50 Ohm controlled impedance transmission lines that are electrically coupled to a center conductor leads 226 of the SMA connectors 235. Thus, the transmission lines 225 can be used to supply a controlled impedance signal path between the output of the SMA connectors 235 and the selected headers 217, when the adapter 200 is mounted to the mother board. Advantageously, this limits the amount of noise in the output signal.

Figure 4:
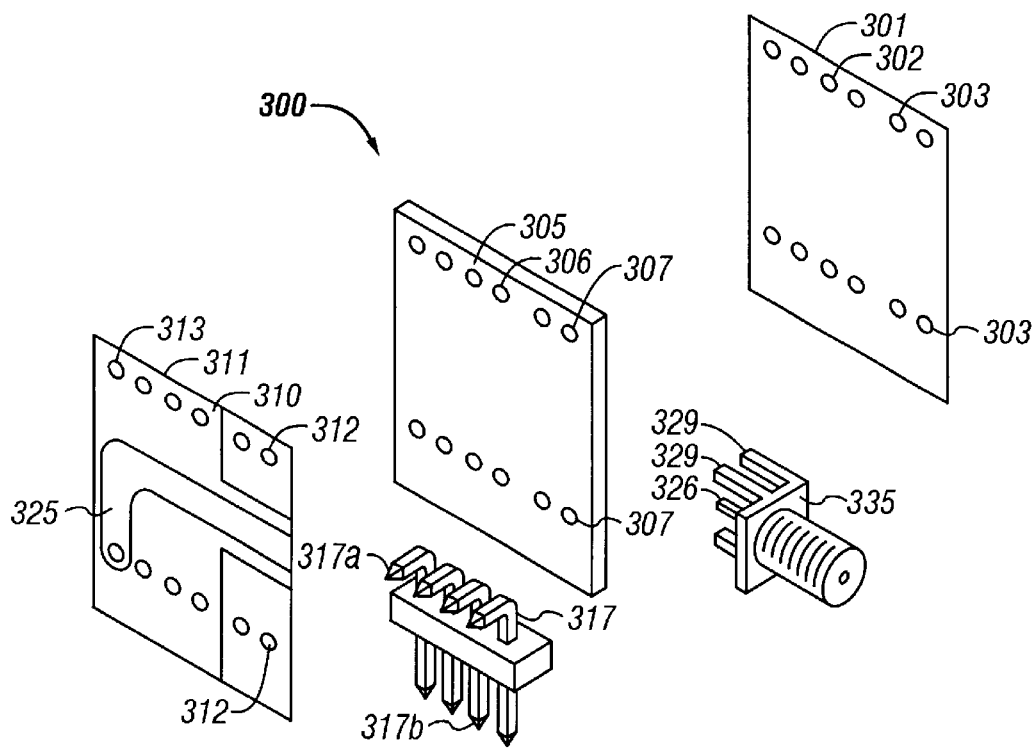
FIG. 4 illustrates a schematic view of a single SMA SIP.

FIG. 4 illustrates an adapter 300 in accordance with a fourth embodiment. In this configuration, the adapter 300 may be a single SMA SIP adapter. The adapter 300 may include a ground plane 301 similar to ground plane 201 having holes 301 and openings 303. The adapter 300 may also include a PCB 305 having holes 306 and openings 307. The PCB 305 may be fabricated from polymer, resins, or plastics. The adapter 300 may also include a bottom layer 310 having a soldered side 311, holes 313, and openings 312. The bottom layer may also include a transmission line 325. In a preferred configuration, the ground plane 301, the PCB, and the bottom layer 310 are, configured to align the holes 313, 307, and 302 to receive the headers 317. Preferably, the ends 317a of the headers 317 are substantially coplanar with the soldered side 311 of the bottom layer 310. The ends 317b of headers 317 may be configured to be adaptable to any conventional mother board or prototyping board. For example, the board may have a standard 100-mill grid mother board pattern.

The adapter 300 may also include a SMA connector 335 having a plurality of leads 329. In a preferred configuration, the transmission line 325 is used to couple a center conductor 326 of the SMA connector 335 to one of the headers 317. Preferably, the PCB 305, the ground plane 301, and the bottom layer 310 are sandwiched between selected fingers 329, when assembled. Further, openings 303, 307, and 312 may be used to connect the PCB 305 to the ground plane 301 and the bottom layer 310.

The preferred adapters are easily mounted to known mother boards or breadboards. Preferably, the adapters include pins that can be easily connected to these known boards. Any known RF connector can be supplied with a suitable interface to operate in the gigahertz frequency without suffering from excessive noise at the output. This is because the preferred adapters are, configured with controlled impedance transmission lines. Preferably, the signal path from the output of the RF connector to a center conductor of the adapters can be electrically connected to the controlled impedance transmission lines. This can substantially preserve the high frequency integrity of the signal. For example, the bandwidths of the preferred adapters on an impedance-matched mother board may be 3.5 gigahertz or more. Accordingly, no additional coaxial cable connections are required. In this way, excessive noise in the output signal from the RF connector can also be minimized.

A number of embodiments of the present invention have been described. Nevertheless, it will be understood that various modifications may be made without departing from the spirit and scope of the invention. For example, the adapter 1 may be a BNC SIP adapter. Other adapters configured with "F" connectors or similar connectors could also be formed in accordance with the present invention. Accordingly, other embodiments are within the scope of the following claims.

What is claimed is:

1. An adapter, comprising:
   a printed circuit board having a plurality of first holes;
   a first layer attached to a first side of the printed circuit board, the first layer having a plurality of second holes;
   a second layer attached to a second side of the printed circuit board, the second layer having a plurality of third holes;
   a plurality of headers passing through the first holes and at least partially through the second and third holes; and
   at least one transmission line formed on one of the first and second layer, the at least one transmission line connecting a radio frequency connector to at least one of the plurality of headers and the at least one transmission line being in electrical communication with the radio frequency connector, and the radio frequency connector being at least partially mounted to the printed circuit board.

2. The adapter of claim 1, wherein the printed circuit board is formed from one of polymer, plastic, and resin.

3. The adapter of claim 1, wherein one of the first layer and the second layer is a ground plane.

4. The adapter of claim 1, wherein the plurality of headers comprises a plurality of first ends that are inserted into one of a breadboard and a prototyping board.

5. The adapter of claim 1, wherein the plurality of headers comprises a plurality of second ends that are substantially coplanar with one of the first and second layers.

6. The adapter of claim 1, wherein the radio frequency connector comprises a connector for attaching to a radio frequency device.

7. The adapter of claim 1, wherein the radio frequency connector operates in the gigahertz range.

8. The adapter of claim 1, wherein the adapter is one of a BNC DIP, a single SMA SIP, a single SMA DIP, and a dual SMA SIP adapter.

9. The adapter of claim 1, wherein the at least one transmission line is a 50 Ohm controlled impedance transmission line.

10. The adapter of claim 1, wherein the at least one transmission line is connected between a center conductor of the radio frequency connector and at least one of the plurality of headers.

11. The adapter of claim 1, wherein the first and second layers and the printed circuit board each contain a plurality openings that are one of vertically and horizontally aligned with each other.

12. The adapter of claim 11, wherein the plurality of openings define a foot print for the radio frequency connector.

13. The adapter of claim 11, wherein the plurality of openings are used to secure the printed circuit board to the first and second layers.

14. The adapter of claim 1, wherein the number of first, second, and third holes is equal to or greater than the number of the plurality of headers.

15. The adapter of claim 1, wherein radio frequency connector is one of a BNC and a SMA connector.

16. An adapter, comprising:
a printed circuit board having a first set of holes;
a ground plane connected at least partially to the printed circuit board, the ground plane having a second set of holes that are aligned with the first set of holes;
a first layer having a third set of holes that are aligned with the first and second sets of holes;
a plurality of headers passing through the first holes and at least partially through the second and third holes; and
at least one transmission line formed on one of the first layer and the ground plane, the at least one transmission line connecting a radio frequency connector to at least one of the plurality of headers and the at least one transmission line being in electrical communication with the radio frequency connector, and the radio frequency connector being at least partially mounted to the printed circuit board.

17. The adapter of claim 16, wherein the radio frequency connector is a BNC connector.

18. The adapter of claim 17, wherein the printed circuit board, the ground plane, and the first layer each contain a plurality of openings that define a foot print for the BNC connector.

19. The adapter of claim 17, wherein the transmission line is connected between a center conductor of the BNC connector and one of the plurality of headers.

20. The adapter of claim 17, wherein the adapter is connected to one of a prototyping board and a mother board via the plurality of headers.

21. The adapter of claim 16, wherein the transmission line is a 50 Ohm controlled impedance transmission line.

22. The adapter of claim 17, wherein the adapter is one of a BNC SIP and a BNC DIP adapter.

23. An adapter, comprising:
a printed circuit board having a first set of holes;
a first layer connected at least partially to the printed circuit board, the first layer having a second set of holes that are aligned with the first set of holes;
a ground plane having a third set of holes that are aligned with the first and second sets of holes;
a plurality of headers passing through the first holes and at least partially through the second and third holes; and
at least one transmission line formed on one of the first layer and the ground plane, the at least one transmission line connecting a radio frequency connector to at least one of the plurality of headers and the at least one transmission line being in electrical communication with the radio frequency connector, and the radio frequency connector being at least partially mounted to the printed circuit board.

24. The adapter of claim 23, wherein the radio frequency connector is a SMA connector.

25. The adapter of claim 24, wherein the printed circuit board, the ground plane, and the first layer are at least partially sandwiched between a plurality of leads of the SMA connector.

26. The adapter of claim 24, wherein the transmission line is connected between a center conductor of the SMA connector and one of the plurality of headers.

27. The adapter of claim 24, wherein the adapter is connected to one of a prototyping board and a mother board via the plurality of headers.

28. The adapter of claim 24, wherein the transmission line is a 50 Ohm controlled impedance transmission line.

29. The adapter of claim 24, wherein the adapter is a single SMA DIP adapter.

30. The adapter of claim 24, wherein the adapter is one of a single SMA SIP and a dual SMA SIP adapter.

* * * * *